(12) United States Patent
Kiyohara et al.

(10) Patent No.: US 11,482,427 B2
(45) Date of Patent: Oct. 25, 2022

(54) SUBSTRATE PROCESSING SYSTEM AND METHOD FOR SUPPLYING PROCESSING FLUID

(71) Applicant: Tokyo Electron Limited, Tokyo (JP)

(72) Inventors: Yasuo Kiyohara, Kumamoto (JP); Hiroaki Inadomi, Kumamoto (JP); Satoshi Okamura, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 455 days.

(21) Appl. No.: 16/578,587

(22) Filed: Sep. 23, 2019

(65) Prior Publication Data

US 2020/0098594 A1 Mar. 26, 2020

(30) Foreign Application Priority Data

Sep. 26, 2018 (JP) .............................. JP2018-180303

(51) Int. Cl.
| | |
|---|---|
| *H01L 21/67* | (2006.01) |
| *B08B 3/10* | (2006.01) |
| *B08B 5/00* | (2006.01) |
| *H01L 21/677* | (2006.01) |

(52) U.S. Cl.
CPC .......... *H01L 21/67034* (2013.01); *B08B 3/10* (2013.01); *B08B 5/00* (2013.01); *H01L 21/67703* (2013.01); *H01L 21/67748* (2013.01)

(58) Field of Classification Search
CPC ......... H01L 21/67034; H01L 21/67703; H01L 21/67748; H01L 21/67017; H01L 21/67028; H01L 21/67109; H01L 21/67051; H01L 21/6776; H01L 21/02052; H01L 21/02343; H01L 21/67098; B08B 3/10; B08B 5/00
See application file for complete search history.

(56) References Cited

U.S. PATENT DOCUMENTS

| | | | |
|---|---|---|---|
| 2004/0035148 A1* | 2/2004 | Whitlock | ................ C01C 1/024 62/617 |
| 2014/0075984 A1* | 3/2014 | Sugawara | .......... B01D 53/0438 62/606 |
| 2018/0158676 A1* | 6/2018 | Kiyohara | .......... H01L 21/67017 |
| 2021/0125840 A1* | 4/2021 | Yoshida | ................ H01L 21/027 |

FOREIGN PATENT DOCUMENTS

| | | |
|---|---|---|
| JP | 2013-251547 A | 12/2013 |
| WO | 2019031303 A | 2/2019 |

* cited by examiner

*Primary Examiner* — Erin F Bergner

(74) *Attorney, Agent, or Firm* — Venjuris, P.C.

(57) ABSTRACT

A substrate processing system includes: a substrate processing apparatus configured to process a substrate with a processing fluid; and a processing fluid supply apparatus configured to supply the processing fluid to the substrate processing apparatus. The processing fluid supply apparatus includes: a circulation line, a gas supply line, a cooler, a pump, a branch line, a heating unit, and a pressure regulator.

11 Claims, 11 Drawing Sheets

SUBSTRATE PROCESSING SYSTEM AND METHOD FOR SUPPLYING PROCESSING FLUID

CROSS-REFERENCE TO RELATED APPLICATIONS

This application is based on and claims priority from Japanese Patent Application No. 2018-180303 filed on Sep. 26, 2018 with the Japan Patent Office, the disclosure of which is incorporated herein in its entirety by reference.

TECHNICAL FIELD

Embodiments disclosed relate to a substrate processing system and a method for supplying a processing fluid.

BACKGROUND

In the related art, a substrate processing apparatus is known in which a liquid film for preventing drying is formed on a surface of a semiconductor wafer (hereinafter, referred to as a "wafer"), which is a substrate, and a drying processing is performed by bringing the wafer on which such a liquid film is formed into contact with a processing fluid of a supercritical state (see, e.g., Japanese Patent Laid-Open Publication No. 2013-251547).

SUMMARY

A substrate processing system according to an aspect of the present disclosure includes a substrate processing apparatus configured to process a substrate with a processing fluid, and a processing fluid supply apparatus configured to supply the processing fluid to the substrate processing apparatus. The processing fluid supply apparatus includes a circulation line, a gas supply line, a cooler, a pump, a branch line, a heating unit, and a pressure regulator. The circulation line is configured to circulate the processing fluid. The gas supply line is configured to supply a gaseous-state processing fluid to the circulation line. The cooler is provided in the circulation line and configured to cool the gaseous-state processing fluid thereby generating a liquid-state processing fluid. The pump is provided at a downstream side of the cooler in the circulation line. The branch line is connected to a downstream side of the pump in the circulation line and configured to branch the liquid-state processing fluid from a branch portion. The heating unit is provided at a downstream side of the branch portion and configured to heat the liquid-state processing fluid in a liquid state thereby generating a supercritical-state processing fluid. The pressure regulator is provided at a downstream side of the heating unit in the circulation line and at an upstream side of the gas supply line and configured to depressurize the supercritical-state processing fluid thereby generating the gaseous-state processing fluid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the related art, a substrate processing apparatus is known in which a liquid film for preventing drying is formed on a surface of a semiconductor wafer (hereinafter, referred to as a "wafer"), which is a substrate, and a drying processing is performed by bringing the wafer on which such a liquid film is formed into contact with a processing fluid of a supercritical state.

In a processing fluid supply apparatus that supplies a processing fluid to such a substrate processing apparatus, piping from a processing fluid supply source to the substrate processing apparatus is formed in series. Therefore, there is a limit to the number of times that foreign matters in the processing fluid can be filtered even if attempt is made to filter the foreign matters in the processing fluid with a filter.

Therefore, when a circulation line is formed in the processing fluid supply apparatus to circulate the processing fluid, and a filter is provided in the circulation line, it is possible to improve the performance of removing the foreign matters by increasing the number of times of filtration.

However, when a processing fluid in a liquid state which is not compressible in the circulation line is sent and circulated by a pump, there is a problem that the influence of pulsation generated by the pump is large. For example, by such pulsation, the pump or the piping may be damaged, or a load may be applied to the welded portion or screw joint portion, so that the life of the pump or the piping may be shortened.

Therefore, when the processing fluid in a liquid state is sent by a pump, it is expected to reduce the influence of pulsation generated by the pump.

<Configuration of Substrate Processing Apparatus>

Figure 1:
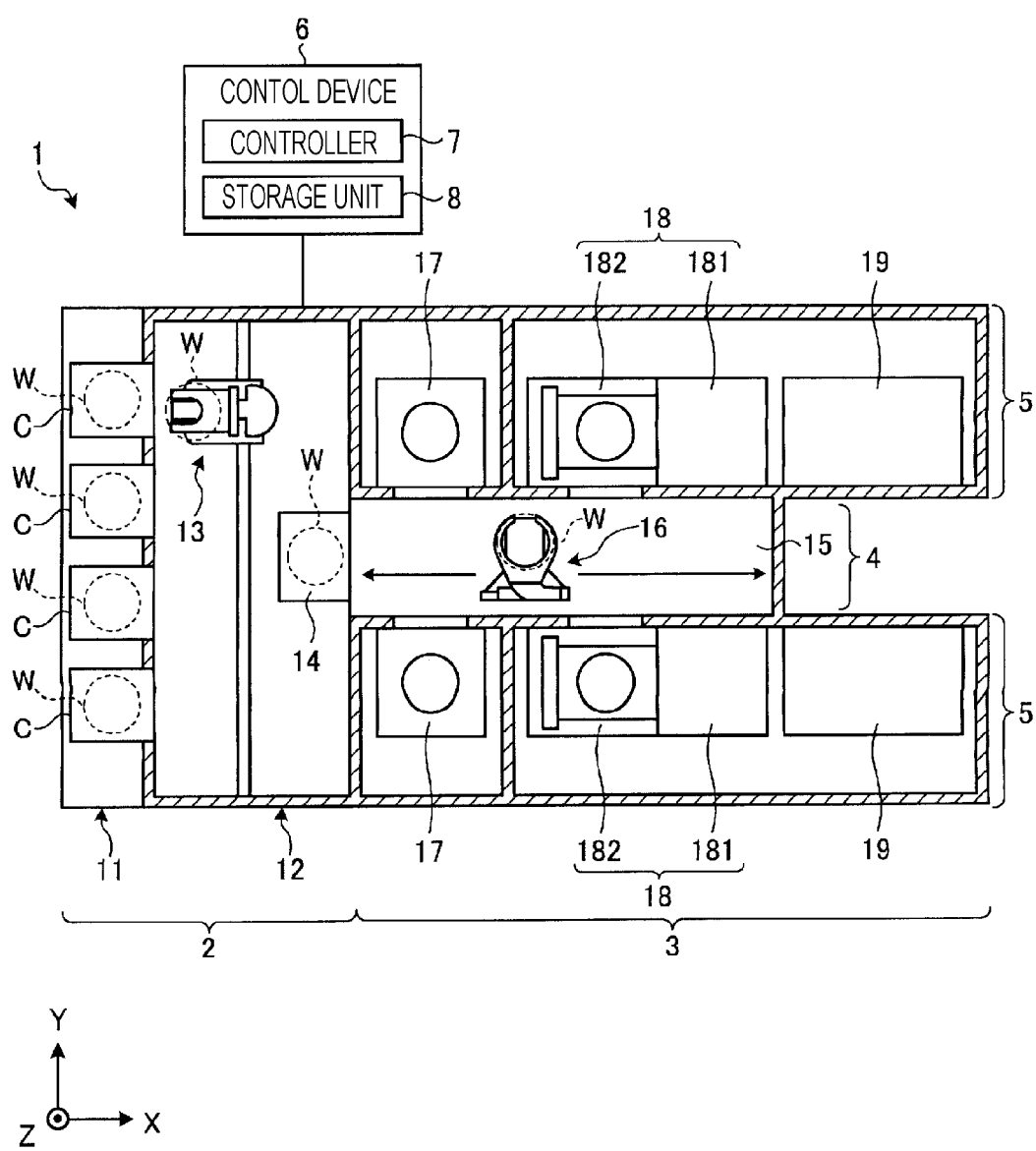
FIG. 1 is a view illustrating an exemplary configuration of a substrate processing apparatus according to an embodiment.

First, descriptions will be made on a configuration of a substrate processing apparatus 1 according to an embodiment with reference to FIG. 1. FIG. 1 is a view illustrating the exemplary configuration of the substrate processing apparatus 1 according to the embodiment. In the following, in order to clarify positional relationships, the X-axis, the Y-axis, and the Z-axis are defined as being orthogonal to each other, and the positive Z-axis direction is regarded as a vertically upward direction.

As illustrated in FIG. 1, the substrate processing apparatus 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed to horizontally accommodate a plurality of semiconductor wafers W (hereinafter, referred to as "wafers W").

The transfer section 12 is provided adjacent to the carrier placing section 11. In the transfer section 12, a transfer device 13 and a delivery unit 14 are disposed.

The transfer device 13 is provided with a wafer holding mechanism configured to hold the wafer W. Further, the transfer device 13 is movable horizontally and vertically and pivotable around a vertical axis. The transfer device 13 transfers the wafers W between the carriers C and the delivery unit 14 by using the wafer holding mechanism.

The processing station 3 is provided adjacent to the transfer section 12. The processing station 3 is provided with a transfer block 4 and a plurality of processing blocks 5.

The transfer block 4 is provided with a transfer area 15 and a transfer device 16. The transfer area 15 is, for example, a rectangular parallelepiped area that extends along a direction in which the carry-in/out station 2 and the processing station 3 are arranged (X axis direction). The transfer device 16 is disposed in the transfer area 15.

The transfer device 16 is provided with a wafer holding mechanism configured to hold the wafer W. Further, the transfer device 16 is movable horizontally and vertically and pivotable around a vertical axis. The transfer device 16 transfers the wafers W between the delivery unit 14 and the plurality of processing blocks 5 by using the wafer holding mechanism.

The plurality of processing blocks 5 are disposed adjacent to the transfer area 15 at both sides of the transfer area 15. Specifically, the plurality of processing blocks 5 are disposed on one side (Y axis positive direction side) of the transfer area 15 and the other side (Y axis negative direction side) thereof in a direction (Y axis direction) orthogonal to the arrangement direction (X axis direction) of the carry-in/out station 2 and the processing station 3.

Further, although not illustrated, the plurality of processing blocks 5 are disposed in multiple tiers (e.g., three tiers) along the vertical direction. Then, the transfer of the wafer W between the processing blocks 5 disposed on the respective tiers and the delivery unit 14 is performed by one transfer device 16 disposed in the transfer block 4. The number of tiers of the plurality of processing blocks 5 is not limited to three tiers.

Each processing block 5 includes a liquid processing unit 17, a drying unit 18, and a supply unit 19. The drying unit 18 is an example of a substrate processor.

The liquid processing unit 17 performs a cleaning processing to clean an upper surface which is a pattern forming surface of the wafer W. Further, the liquid processing unit 17 performs a liquid film forming processing to form a liquid film on the upper surface of the wafer W after the cleaning processing. The configuration of the liquid processing unit 17 will be described later.

The drying unit 18 performs a supercritical drying processing on the wafer W after the liquid film forming processing. Specifically, the drying unit 18 dries the wafer W by bring the wafer W after liquid film forming processing into contact with the processing fluid in a supercritical state (hereinafter, also referred to as a "supercritical fluid"). The configuration of the drying unit 18 will be described later.

The supply unit 19 supplies the processing fluid to the drying unit 18. Specifically, the supply unit 19 includes a supply device group that includes a flow meter, a flow rate regulator, a back pressure valve, a heater, and the like, and a case that accommodates the device group. In the present embodiment, the supply unit 19 supplies $CO_2$ serving as the processing fluid to the drying unit 18. The configuration of the supply unit 19 will be described later.

Further, a processing fluid supply apparatus 60 (see FIG. 4) which supplies the processing fluid is connected to the supply unit 19. In the embodiment, the processing fluid supply apparatus 60 supplies $CO_2$ serving as the processing fluid to the supply unit 19. Details of the processing fluid supply apparatus 60 will be described later.

The liquid processing unit 17, the drying unit 18, and the supply unit 19 are arranged along the transfer area 15 (i.e., along the X axis direction). Among the liquid processing unit 17, the drying unit 18, and the supply unit 19, the liquid processing unit 17 is disposed at a position closest to the carry-in/out station 2, and the supply unit 19 is disposed at a position farthest from the carry-in/out station 2.

As described above, each of the processing blocks 5 include one liquid processing unit 17, one drying unit 18, and one supply unit 19, respectively. That is, the substrate processing apparatus 1 is provided with the same number of the liquid processing units 17, transfer devices 16, and supply units 19.

Further, the drying unit 18 includes a processing area 181 in which the supercritical drying processing is performed, and a delivery area 182 in which the wafer W is delivered between the transfer block 4 and the processing area 181. The processing area 181 and the delivery area 182 are arranged along the transfer area 15.

Specifically, among the processing area 181 and the delivery area 182, the delivery area 182 is disposed on a side closer to the liquid processing unit 17 than the processing area 181. That is, in the respective processing blocks 5, the liquid processing unit 17, the delivery area 182, the processing area 181, and the supply unit 19 are disposed in this order along the transfer area 15.

As illustrated in FIG. 1, the substrate processing apparatus 1 includes a control device 6. The control device 6 is, for example, a computer, and includes a controller 7 and a storage unit 8.

The controller 7 includes a microcomputer having a central processing unit (CPU), a read only memory (ROM), a random access memory (RAM), and an input/output port, and various circuits. The CPU in the microcomputer reads out and executes a program stored in the ROM, thereby implementing control of the transfer devices 13 and 16, the liquid processing unit 17, the drying unit 18, and the supply unit 19.

The program may be recorded in a computer-readable recording medium, and installed from the recording medium to the storage unit 8 of the control device 6. The computer-readable recording medium may be, for example, a hard disk (HD), a flexible disk (FD), a compact disk (CD), a magnet optical disk (MO), or a memory card.

The storage unit 8 is implemented by, for example, a semiconductor memory element such as a RAM or a flash memory, or a storage device such as a hard disk or an optical disk.

In the substrate processing apparatus 1 configured as described above, the transfer device 13 of the carry-in/out station 2 first takes out a wafer W from a carrier C placed in the carrier placing section 11, and then, places the taken wafer W on the delivery unit 14. The wafer W placed on the delivery unit 14 is taken out from the delivery unit 14 by the transfer device 16 of the processing station 3, and carried into the liquid processing unit 17.

The wafer W carried into the liquid processing unit 17 is carried out from the liquid processing unit 17 by the transfer device 16 after the cleaning processing and the liquid film forming processing are performed by the liquid processing unit 17. The wafer W carried out from the liquid processing unit 17 is carried into the drying unit 18 by the transfer device 16, and the drying processing is performed thereon by the drying unit 18.

The wafer W dried by the drying unit 18 is carried out from the drying unit 18 by the transfer device 16, and is placed on the delivery unit 14. Then, after the processing of placing the wafer W on the delivery unit 14, the wafer W returns to the carrier C of the carrier placing section 11 by the transfer device 13.

<Configuration of Liquid Processing Unit>

Figure 2:
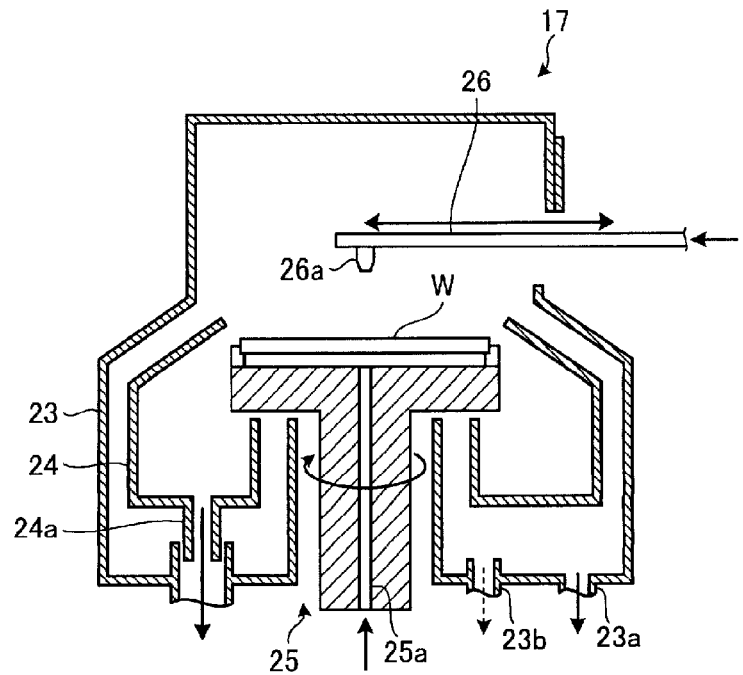
FIG. 2 is a view illustrating an exemplary configuration of a liquid processing unit according to the embodiment.

Next, descriptions will be made on the configuration of the liquid processing unit 17 with reference to FIG. 2. FIG. 2 is a view illustrating an exemplary configuration of the liquid processing unit 17. The liquid processing unit 17 is configured, for example, as a single wafer type cleaning apparatus that cleans the wafers W one by one by spin cleaning.

As illustrated in FIG. 2, the liquid processing unit 17 substantially horizontally holds the wafer W by a wafer holding mechanism 25 disposed in an outer chamber 23 that forms a processing space, and rotates the wafer W by rotating the wafer holding mechanism 25 around the vertical axis.

Then, the liquid processing unit 17 causes a nozzle arm 26 to enter above the rotating wafer W, and supplies a chemical liquid or a rinse liquid from a chemical liquid nozzle 26a provided at the tip of the nozzle arm 26 in a predetermined order, and thereby performing the cleaning processing of the upper surface of the wafer W.

Further, in the liquid processing unit 17, a chemical liquid supply path 25a is also formed inside the wafer holding mechanism 25. Then, the lower surface of the wafer W is also cleaned by the chemical liquid or a rinse liquid supplied from the chemical liquid supply path 25a.

In the cleaning processing, for example, particles or organic pollutants are first removed by a mixed solution of ammonia and hydrogen peroxide solution (SC1 solution) which is an alkaline chemical solution. Next, the rinse cleaning is performed with deionized water (hereinafter, referred to as "DIW"), which is a rinse liquid.

Next, a natural oxide film is removed by diluted hydro-fluoric acid (hereinafter, referred to as "DHF"), which is an acid chemical solution, and subsequently, the rinse cleaning with the DIW is performed.

The various chemical solutions described above are received by the outer chamber 23 or an inner cup 24 disposed in the outer chamber 23, and discharged from a liquid drain port 23a provided on the bottom of the outer chamber 23 or a liquid drain port 24a provided on the bottom of the inner cup 24. Further, the atmosphere in the outer chamber 23 is exhausted from an exhaust port 23b provided on the bottom of the outer chamber 23.

The liquid film forming processing is performed after the rinse processing in the cleaning processing. Specifically, the liquid processing unit 17 supplies isopropyl alcohol in a liquid state (hereinafter, also referred to as "IPA liquid") on the upper surface and the lower surface of the wafer W, while rotating the wafer holding mechanism 25. As a result, the DIW remaining on the both surfaces of the wafer W is substituted with the IPA. Thereafter, the liquid processing unit 17 gently stops the rotation of the wafer holding mechanism 25.

The wafer W after the light film forming processing is delivered to the transfer device 16 by a delivery mechanism (not illustrated) provided in the wafer holding mechanism 25, in a state where the liquid film of the IPA is formed on the upper surface thereof, and is carried out from the liquid processing unit 17.

The liquid film formed on the wafer W prevents the occurrence of pattern collapse due to evaporation (vaporization) of the liquid on the upper surface of the wafer W, during the transfer of the wafer W from the liquid processing unit 17 to the drying unit 18, or the operation of carrying into the drying unit 18.

<Configuration of Drying Unit>

Figure 3:
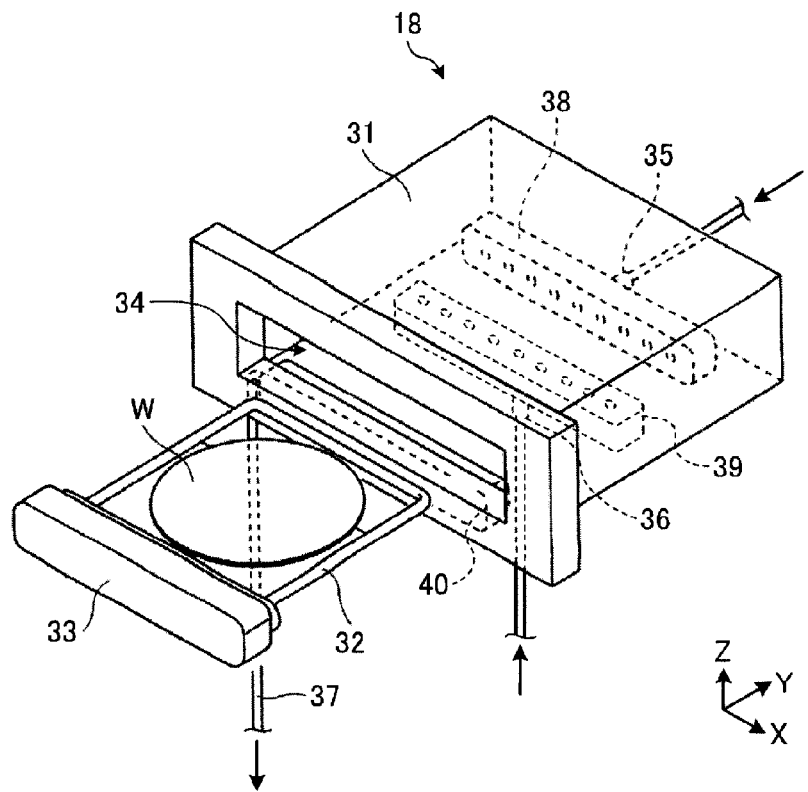
FIG. 3 is a schematic perspective view illustrating an exemplary configuration of a drying unit according to the embodiment.

Consequently, descriptions will be made on the configuration of the drying unit 18 with reference to FIG. 3. FIG. 3 is a schematic perspective view illustrating an exemplary configuration of the drying unit 18.

The drying unit 18 includes a body 31 and a holding plate 32, and a lid member 33. An opening 34 for carrying-in/out the wafer W is formed in the case type body 31. The holding plate 32 holds the wafer W which is a processing target in the horizontal direction. The lid member 33 supports the holding plate 32, and closes the opening 34 when the wafer W is carried into the body 31.

The body 31 is a container in which a processing space capable of accommodating a wafer W having a diameter of, for example, 300 mm is formed therein, and supply ports 35 and 36, and a discharge port 37 are provided in the wall portion. The supply ports 35 and 36, and the discharge port 37 are connected to a supply flow path and a discharge path for distributing the supercritical fluid to the drying unit 18, respectively.

The supply port 35 is connected to the side surface opposite to the opening 34, in the case type body 31. Further, the supply port 36 is connected to the bottom surface of the body 31. Further, the discharge port 37 is connected to the lower side of the opening 34. Although two supply ports 35 and 36, and one discharge port 37 are illustrated in FIG. 3, the number of the supply ports 35 and 36, or the discharge port 37 is not particularly limited.

Further, fluid supply headers 38 and 39, and a fluid discharge header 40 are provided inside the body 31. Then, a plurality of supply ports are formed in the fluid supply headers 38 and 39 side by side in a longitudinal direction of the fluid supply headers 38 and 39, and a plurality of discharge ports are formed in the fluid discharge header 40 side by side in a longitudinal direction of the fluid discharge header 40.

The fluid supply header 38 is connected to the supply port 35, and is provided adjacent to the side surface opposite to the opening 34 inside the case type body 31. Further, the plurality of supply ports formed side by side in the fluid supply header 38 faces the opening 34 side.

The fluid supply header 39 is connected to the supply port 36, and is provided at the center of the bottom surface inside the case type body 31. Further, the plurality of supply ports formed side by side in the fluid supply header 39 faces upward.

The fluid discharge header 40 is connected to the discharge port 37, and is adjacent to the side surface of the opening 34, and provided lower than the opening 34 inside the case type body 31. Further, the plurality of discharge ports formed side by side in the fluid discharge header 40 faces upward.

The fluid supply headers 38 and 39 supply the supercritical fluid to the inside of the body 31. Further, the fluid discharge header 40 guides the supercritical fluid inside the body 31 to the outside of the body 31 to discharge. The supercritical fluid discharged to the outside of the body 31 through the fluid discharge header 40 contains the IPA liquid dissolved in the supercritical fluid in a supercritical state from the surface of the wafer W.

In the drying unit 18, the IPA liquid in the space between the patterns formed on the wafer W is gradually dissolved in the supercritical fluid by coming into contact with the supercritical fluid in a high-pressure state (e.g., 16 MPa), and is gradually substituted with the supercritical fluid in the space between the patterns. Then, finally, the space between the patterns is filled only by the supercritical fluid.

Then, after the IPA liquid is removed from the space between the patterns, the pressure inside the body 31 is reduced from the high pressure to the atmospheric pressure, so that $CO_2$ is changed from a supercritical state to a gaseous state, and the space between the patterns is occupied only by the gas. In this manner, the IPA liquid in the space between the patterns is removed, and the drying processing of the wafer W is completed.

Here, the supercritical fluid has a low viscosity as compared with the liquid (e.g., IPA liquid), as well as a high ability to dissolve the liquid, and no interface between the supercritical fluid and a liquid or a gas in equilibrium. Therefore, it is possible to dry a liquid without being affected by the surface tension in the drying processing using the supercritical fluid. Therefore, according to the embodiment, it is possible to suppress the pattern from being collapsed during the drying processing.

In the embodiment, although the example in which the IPA liquid is used as a liquid for preventing drying, and $CO_2$ in a supercritical state is used as the processing fluid is described, a liquid other than the IPA may be used as a liquid for preventing drying, and a fluid other than $CO_2$ in a supercritical state may be used as the processing fluid.

<Configuration of Substrate Processing System>

Figure 4:
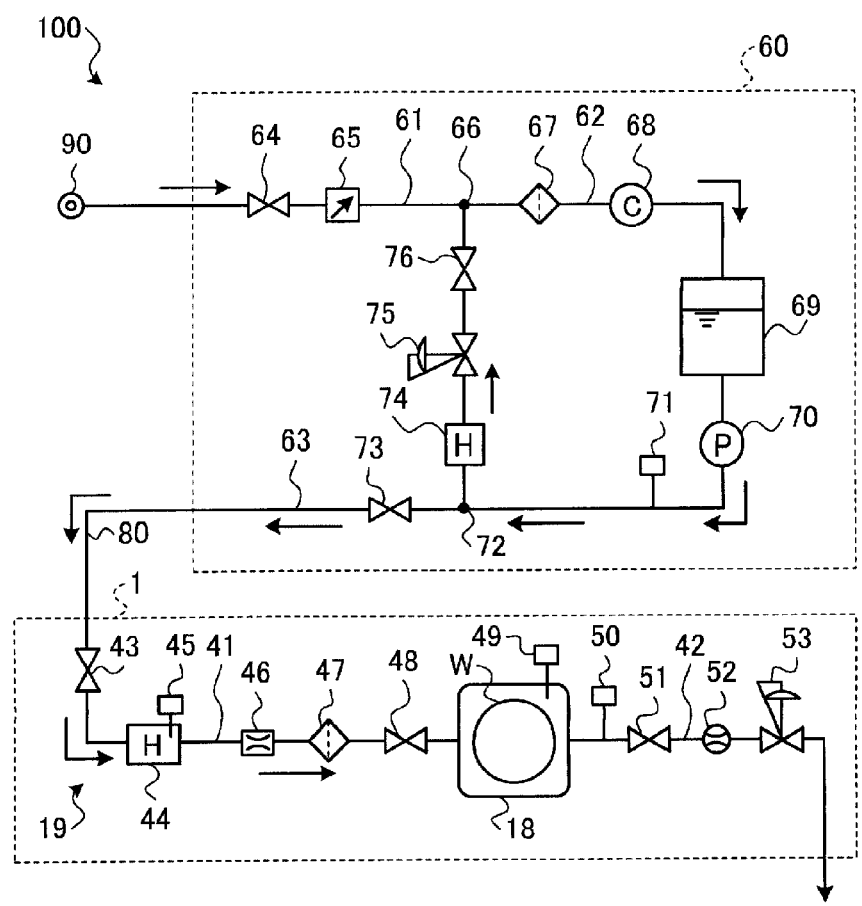
FIG. 4 is a view illustrating an exemplary configuration of an entire system of a substrate processing system according to the embodiment.

Consequently, descriptions will be made on a configuration of a substrate processing system 100 according to the embodiment with reference to FIG. 4. FIG. 4 is a view illustrating an exemplary configuration of an entire system of the substrate processing system 100 according to the embodiment. Each unit of the substrate processing system 100 illustrated below may be controlled by the controller 7.

The substrate processing system 100 includes a processing fluid supply source 90, the processing fluid supply apparatus 60, and the substrate processing apparatus 1. The processing fluid supply device 60 supplies the processing fluid supplied from the processing fluid supply source 90 to the substrate processing apparatus 1. As described above, the substrate processing apparatus 1 includes the drying unit 18 and the supply unit 19, and processes the wafer W in the drying unit 18, with the processing fluid supplied through the supply unit 19.

The processing fluid supply apparatus 60 includes a gas supply line 61, a circulation line 62, and a branch line 63. The gas supply line 61 is connected to the processing fluid supply source 90, and supplies the processing fluid in a gaseous state from the processing fluid supply source 90 to the circulation line 62. Further, the processing fluid supply source 90 is connected to a connecting portion 66 via a valve 64 and a flow rate regulator 65.

The circulation line 62 is a circulation line which comes out from the connecting portion 66 that is a portion connected with the gas supply line 61, and returns to the connecting portion 66. In the circulation line 62, a filter 67, a condenser 68, a tank 69, a pump 70, a pressure sensor 71, a branch 72, a spiral heater 74, a back pressure valve 75, and a valve 76 are provided in order from the upstream side with respect to the connecting portion 66.

The filter 67 filters the processing fluid in a gaseous state flowing in the circulation line 62 to remove foreign matters contained in the processing fluid. By removing the foreign matters in the processing fluid by the filter 67, it is possible to prevent the occurrence of particles on the surface of the wafer W during the drying processing of the wafer W using the supercritical fluid.

The condenser 68 is an example of a cooler. The condenser 68 is connected, for example, to a cooling water supply (not illustrated), and may exchange heat between the cooling water and the processing fluid in a gaseous state. Therefore, the condenser 68 cools the processing fluid in a gaseous state flowing in the circulation line 62 to generate the processing fluid in a liquid state.

The tank 69 stores the processing fluid in a liquid state generated by the condenser 68. The pump 70 sends the processing fluid in a liquid state stored in the tank 69 to the downstream side of the circulation line 62. That is, the pump 70 forms a circulating flow of the processing fluid that comes out from the tank 69 and returns to the tank 69 through the circulation line 62. The pressure sensor 71 measures the circulating pressure of the processing fluid flowing through the circulation line 62.

One or more branch lines 63 are branched from the branch 72 of the circulation line 62. In other words, one or more branch lines 63 are connected to the branch 72. The branch lines 63 are connected to the corresponding substrate processing apparatus 1, and supply the processing fluid in a liquid state flowing through the circulation line 62 to the corresponding substrate processing apparatus 1.

Further, a valve 73 is provided on the branch line 63 in the processing fluid supply apparatus 60. The valve 73 is a valve for adjusting on/off of the flow of the processing fluid. The valve 73 allows the processing fluid to flow to the branch line 63 on the downstream side in the open state, and does not allow the processing fluid to the branch line 63 on the downstream side in the closed state.

The spiral heater 74 is an example of a heating unit. The spiral heater 74 is wound around the circulation line 62, and heats the processing fluid in a liquid state flowing through the circulation line 62 to generate the processing fluid in a supercritical state.

The back pressure valve 75 is an example of a pressure regulator. The back pressure valve 75 is configured to maintain a primary side pressure at a set pressure by adjusting the valve opening degree to cause the fluid to flow to the secondary side when the primary side pressure of the circulation line 62 exceeds the set pressure.

Then, the back pressure valve 75 depressurizes the processing fluid in a supercritical state flowing through the circulation line 62 to generate the processing fluid in a liquid state. The valve opening degree and the set pressure of the back pressure valve 75 may be changed by the controller 7 at any time.

The valve 76 is a valve for adjusting on/off of the flow of the processing fluid. The valve 76 allows the processing fluid to flow to the circulation line 62 on the downstream side in the open state, and does not allow the processing fluid to the circulation line 62 on the downstream side in the closed state.

Then, the processing fluid in a gaseous state generated by the back pressure valve 75 returns to the connecting portion 66 of the circulation line 62 via the valve 76.

Next, the system configuration of the substrate processing apparatus 1 will be described. The processing fluid flowing through the branch line 63 is supplied to the drying unit 18 through a supply line 41 of the supply unit 19, and is discharged from the drying unit 18 to the outside through a discharge line 42. The branch line 63 of the processing fluid supply apparatus 60 and the supply line 41 of the substrate processing apparatus 1 is connected by a connecting line 80 provided in a factory or the like.

On the supply line 41, a valve 43, a heater 44 and a temperature sensor 45, an orifice 46, a filter 47, and a valve 48 are provided in order from the upstream side.

The valve 43 is a valve for adjusting on/off of the flow of the processing fluid. The valve 43 allows the processing fluid to flow to the supply line 41 on the downstream side in the open state, and does not allow the processing fluid to the supply line 41 on the downstream side in the closed state.

The heater 44 is an example of another heating unit. The heater 44 heats the processing fluid in a liquid state flowing through the supply line 41 to generate the processing fluid in a supercritical state. The temperature sensor 45 detects the temperature of the processing fluid in a supercritical state generated by the heater 44.

The orifice 46 serves to adjust the pressure by reducing the flow velocity of the processing fluid in a supercritical state generated by the heater 44. The orifice 46 may distribute the processing fluid in a supercritical state whose pressure is adjusted to, for example, about 16 MPa, to the supply line 41 on the downstream side.

The filter 47 filters the processing fluid in a supercritical state flowing in the supply line 41 to remove foreign matters contained in the processing fluid. By removing the foreign matters in the processing fluid by the filter 47, it is possible to prevent the occurrence of particles on the surface of the wafer W during the drying processing of the wafer W using the supercritical fluid.

The valve 48 is a valve for adjusting on/off of the flow of the processing fluid. The valve 48 allows the processing fluid to flow to the drying unit 18 on the downstream side in the open state, and does not allow the processing fluid to the drying unit 18 on the downstream side in the closed state.

A temperature sensor 49 is provided in the drying unit 18. The temperature sensor 49 measures the temperature of the processing fluid filled inside the drying unit 18.

On the discharge line 42, a pressure sensor 50, a valve 51, a flow meter 52, and a back pressure valve 53 are provided in order from the upstream side. The pressure sensor 50 measures the pressure of the processing fluid flowing through the discharge line 42. Since the pressure sensor 50 is directly connected to the drying unit 18 through the discharge line 42, the pressure of the processing fluid measured by the pressure sensor 50 is substantially the same value of the internal pressure of the processing fluid in the drying unit 18.

The valve 51 is a valve for adjusting on/off of the flow of the processing fluid. The valve 51 allows the processing fluid to flow to the discharge line 42 on the downstream side in the open state, and does not allow the processing fluid to the discharge line 42 on the downstream side in the closed state. The flow meter 52 measures the flow rate of the processing fluid flowing through the discharge line 42.

The back pressure valve 53 is configured to maintain the primary side pressure at the set pressure by adjusting the valve opening degree to cause the fluid to flow to the secondary side when the primary side pressure of the discharge line 42 exceeds the set pressure. The valve opening degree and the set pressure of the back pressure valve 53 may be changed by the controller 7 at any time.

<Substrate Processing of Embodiment>

Figure 5:
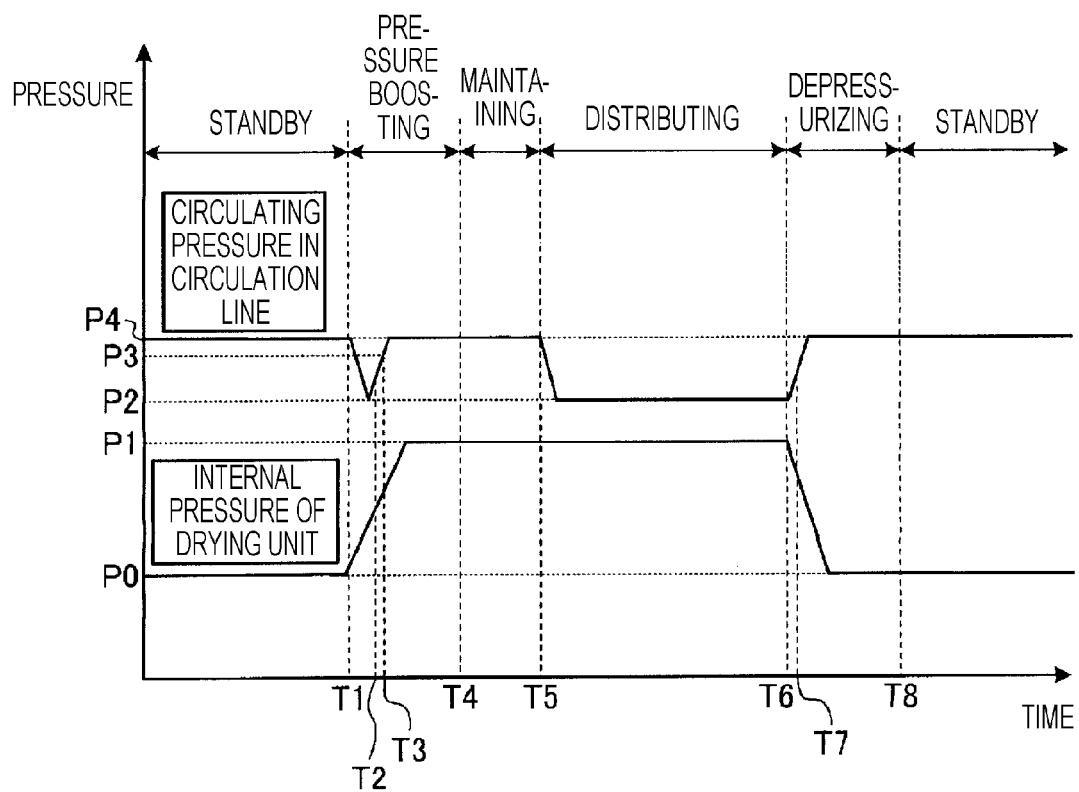
FIG. 5 is a view illustrating changes in a circulating pressure in a circulation line and an internal pressure of the drying unit according to the embodiment.

Consequently, descriptions will be made on details of the substrate processing of the substrate processing system 100 according to the embodiment with reference to FIGS. 5 to 9. FIG. 5 is a view illustrating changes in the circulating pressure in a circulation line 62 and the internal pressure of the drying unit 18 according to the embodiment.

As illustrated in FIG. 5, in the substrate processing system 100, a standby processing is performed until time T1. In the standby processing, the internal pressure of the drying unit 18 is a predetermined pressure P0 (e.g., atmospheric pressure), and the circulating pressure in the pressure line 62 is a predetermined pressure P4 (e.g., 19 MPa).

Figure 6:
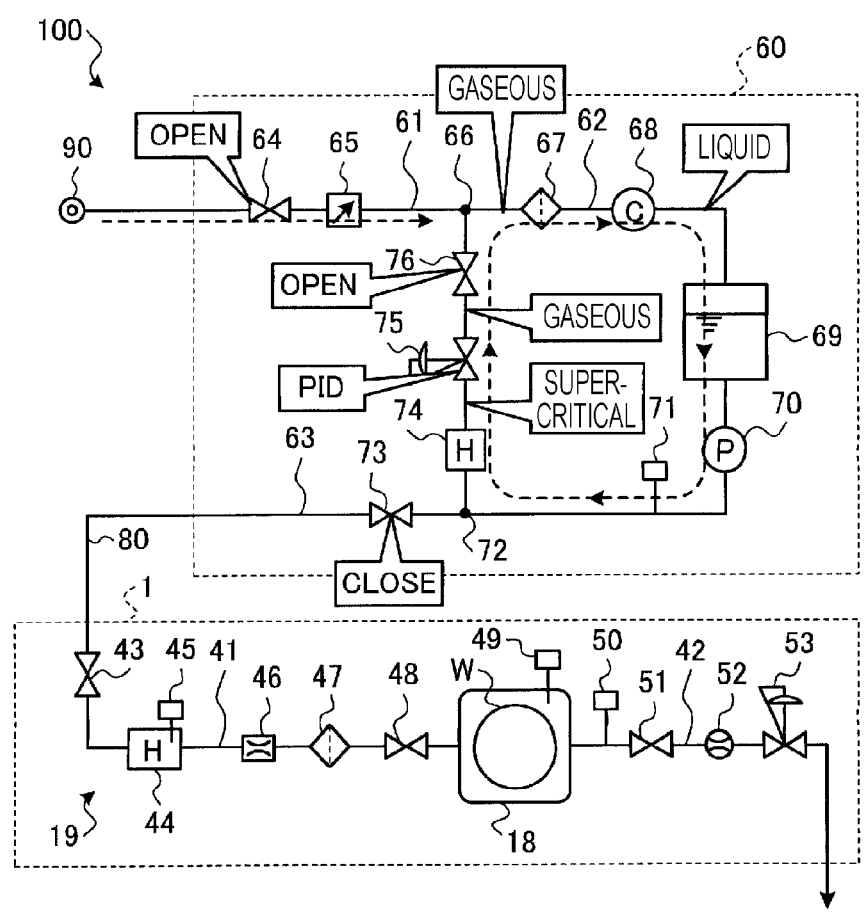
FIG. 6 is a view for explaining a standby processing of the substrate processing system according to the embodiment.

FIG. 6 is a view for explaining the standby processing of the substrate processing system 100 according to the embodiment. As illustrated in FIG. 6, since the valve 64 is opened during the standby processing, the processing fluid in a gaseous state is supplied to the circulation line 62 from the processing fluid supply source 90 through the valve 64, the flow rate regulator 65, and the connecting portion 66.

Further, since the processing fluid circulating in the circulation line 62 is also in a gaseous state at the downstream of the back pressure valve 75, the processing fluid in a gaseous state flowing through the gas supply line 61 and the circulation line 62 merges at the connecting portion 66.

Then, the processing fluid in a gaseous state merged is filtered by the filter 67 at the downstream of the connecting portion 66. Here, the filter 67 may improve the removal performance of the foreign matters contained in the processing fluid by filtering the processing fluid in a gaseous state rather than filtering the processing fluid in a liquid state or a supercritical state.

That is, in the embodiment, the foreign matters contained in the processing fluid may be removed effectively by providing the filter 67 at a portion where the processing fluid in a gaseous state is flowing in the circulation line 62. Therefore, according to the embodiment, it is possible to effectively prevent the occurrence of particles on the surface of the wafer W during the drying processing of the wafer W using the supercritical fluid.

The processing fluid in a gaseous state filtered by the filter 67 is cooled by the condenser 68 to become the processing fluid in a liquid state, and is stored in the tank 69. Then, the processing fluid stored in the tank 69 is sent to the downstream side of the circulation line 62 by the pump 70.

Then, the processing fluid in a liquid state passing through the branch 72 is heated by the spiral heater 74 to become the processing fluid in a supercritical state. Further, the processing fluid in a supercritical state is depressurized by the back pressure valve 75 to become the processing fluid in a gaseous state.

In order to maintain the circulating pressure in the circulation line 62 at the predetermined pressure P4, the valve opening degree of the back pressure valve 75 is controlled by, for example, a proportional-integral-differential (PID) control, based on the pressure measured by the pressure sensor 71.

Then, the processing fluid that has become a gaseous state by the back pressure valve 75 flows to the connecting portion 66 through the valve 76 in the open state. When the substrate processing system 100 is performing the standby processing, the processing fluid is not supplied to the substrate processing apparatus 1, and thus, the valve 73 on the branch line 63 is in the closed state.

Here, in the embodiment, the phase of the processing fluid is changed by the spiral heater 74 from a liquid state to a supercritical state between the pump 70 and the back pressure valve 75. That is, the space between the pump 70 and the valve 73 or the back pressure valve 75 which can be in the closed state is not filled with the processing fluid in a liquid state which is not compressible, but is filled with the processing fluid in a supercritical state which is partially compressible.

Therefore, even when the processing fluid in a liquid state which is not compressible in the circulation line 62 is sent by the pump 70 and circulated, the pulsation generated by the pump 70 may be absorbed in the portion in a supercritical state. Therefore, according to the embodiment, when the processing fluid in a liquid state is sent by the pump 70, the influence of the pulsation generated by the pump 70 may be reduced.

The description will refer back to FIG. 5. In the substrate processing system 100, a pressure boosting processing in which the internal pressure of the drying unit 18 is boosted to a predetermined pressure P1 (e.g., 16 MPa) is performed from time T1 to time T4. Then, a maintaining processing in which the inside of the drying unit 18 is maintained at the pressure P1 from time T4 to time T5.

Figure 7:
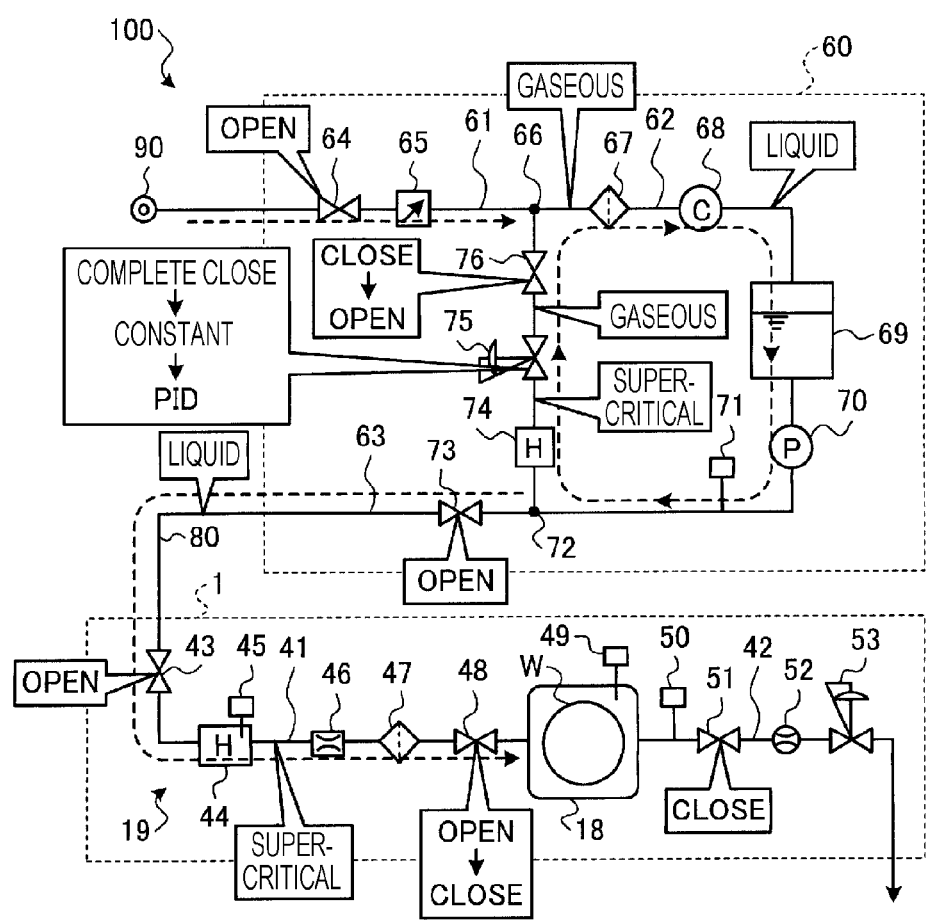
FIG. 7 is a view for explaining a pressure boosting processing and a maintaining processing of the substrate processing system according to the embodiment.

FIG. 7 is a view for explaining the pressure boosting processing and the maintaining processing of the substrate processing system 100 according to the embodiment. In the following description, descriptions on portions which are in the same state as the processings that has already been described may be omitted.

As illustrated in FIG. 7, in order to fill the drying unit 18 with the processing fluid, the valve 73, the valve 43, and the valve 48 become the open state, and the valve 51 becomes the closed state, at time T1 from which the pressure boosting processing is started.

Therefore, the processing fluid circulating in the circulation line 62 reaches the heater 44 in a liquid state, and the phase thereof is changed to a supercritical state by the heater 44. Then, the processing fluid which has become a supercritical state is filled to the drying unit 18.

As described above, in the embodiment, the processing fluid is supplied from the processing fluid supply apparatus 60 to the substrate processing apparatus 1 in a liquid state, rather than a gaseous state or a supercritical state. Therefore, even if the distance between the processing fluid supply apparatus 60 and the substrate processing apparatus 1, that is, the length of the connecting line 80 is varied, problems due to the variation in the length may be reduced.

Further, when the valve 73, the valve 43, and the valve 48 become the open state, the valve opening degree of the back pressure valve 75 becomes the complete closed state and the valve 76 becomes the closed state, so that the circulation of the processing fluid in the circulation line 62 is temporarily stopped. Therefore, the processing fluid may be supplied to the substrate processing apparatus 1 at a stretch.

Then, as illustrated in FIG. 5, although the circulating pressure in the circulation line 62 is temporarily reduced from the pressure P4 immediately after the pressure boosting processing is started, the circulating pressure increases as the drying unit 18 is filled with the processing fluid.

Then, as illustrated in FIG. 7, at time T2 at which a predetermined time (e.g., three seconds) has elapsed from time T1, the valve opening degree of the back pressure valve 75 is changed from the complete closed state to a predetermined constant opening degree, and the valve 76 becomes the open state, so that the circulation of the processing fluid in the circulation line 62 is resumed.

Next, as illustrated in FIG. 5, the circulating pressure in the circulation line 62 is further increased, and the valve opening degree of the back pressure valve 75 is switched to the PID control at time T3 at which a predetermined pressure P3 (e.g., 18 MPa) is reached, as illustrated in FIG. 7. Therefore, as illustrated in FIG. 5, after the circulating pressure in the circulation line 62 reaches the pressure P4, the circulating pressure may be maintained at the pressure P4.

As described above, instead of immediately changing the valve opening degree of the back pressure valve 75 from the complete closed state to the PID control, a predetermined constant opening degree is set therebetween, and thus, it is possible to suppress the circulating pressure in the circulation line 62 from overshooting from the pressure P4 in the PID control.

Then, as illustrated in FIG. 7, at time T4 at which a moment elapsed for a while after the internal pressure of the drying unit 18 reaches the predetermined pressure P1, the valve 48 at the upstream side of the drying unit 18 becomes the closed state, and the inside of the drying unit 18 is maintained at the pressure P1.

In the maintaining processing, IPA concentration and $CO_2$ concentration of the mixed fluid of the processing fluid and the IPA liquid mixed between the patterns formed on the wafer W is maintained until they reach a predetermined concentration (e.g., the IPA concentration is 30% or less, and the $CO_2$ concentration is 70% or more).

Figure 8:
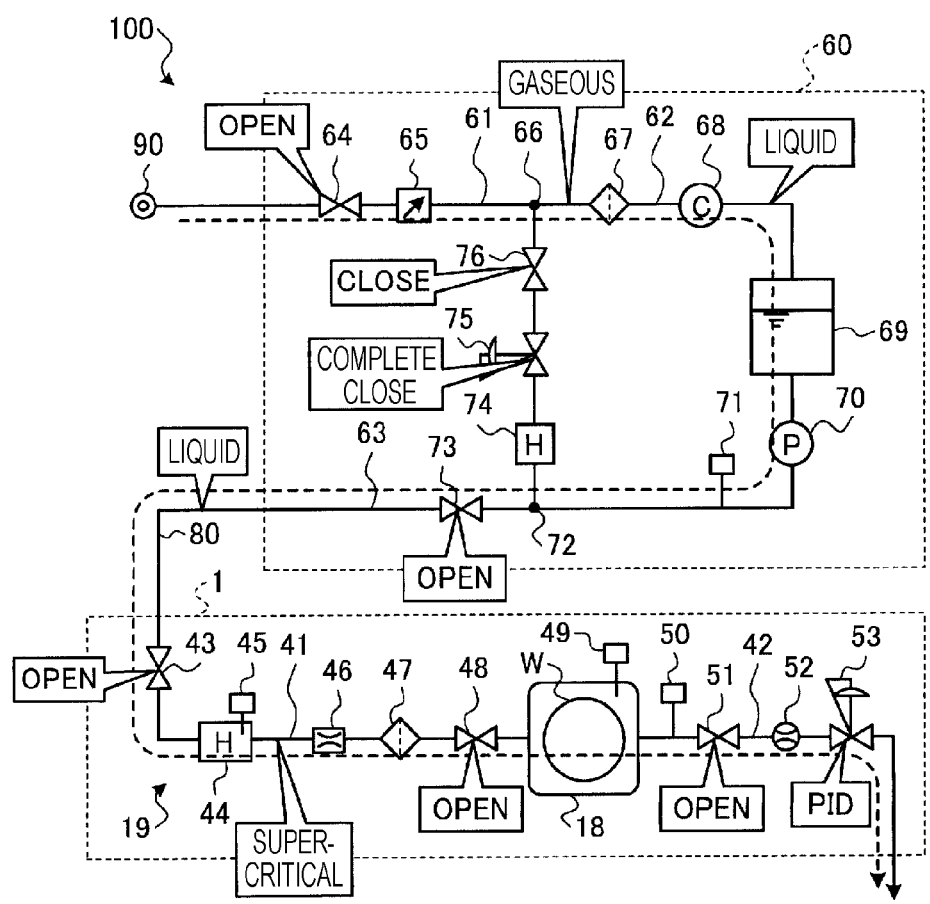
FIG. 8 is a view for explaining a distribution processing of the substrate processing system according to the embodiment.

Following the maintaining processing, a distributing processing is performed from time T5 to time T6 in the substrate processing system 100. FIG. 8 is a view for explaining the distributing processing of the substrate processing system 100 according to the embodiment.

As illustrated in FIG. 8, in order to distribute the processing fluid in the drying unit 18, the valve 51 becomes the open state, and the valve opening degree of the back pressure valve 53 is PID-controlled, at time T5 at which the distributing processing is started. Therefore, as illustrated in FIG. 5, the internal pressure of the drying unit 18 is continuously maintained at the predetermined pressure P1.

Further, since the processing fluid is always supplied to the substrate processing apparatus 1 during the distributing processing, the circulating pressure in the circulation line 62 is reduced from the pressure P4 to the pressure P2 (e.g., 17 MPa). In the embodiment, since the discharge capacity of the pump 70 and the consumption amount of the processing fluid in the distributing processing are substantially equal, as illustrated in FIG. 8, the valve opening degree of the back pressure valve 75 becomes the complete closed state and the valve 76 becomes the closed state, so that the circulation of the processing fluid in the circulation line 62 is stopped.

Here, in the distributing processing of the embodiment, the temperature of the processing fluid in the drying unit 18 may be 90° C. or higher. When the temperature of the processing fluid in the drying unit 18 is lower than a predetermined temperature (e.g., 83° C.), the processing fluid will not be in a 100% supercritical state, so that the foreign matters dissolved in the processing fluid may be deposited in the drying unit 18.

Then, by the deposited foreign matters, during the drying processing of the wafer W using the supercritical fluid, large amount of particles may occur on the surface of the wafer W.

However, in the embodiment, since the temperature of the processing fluid in the drying unit 18 is 90° C. or higher, it is possible to prevent the occurrence of particles on the surface of the wafer W during the drying processing of the wafer W using the supercritical fluid. Desirably, the temperature of the processing fluid in the drying unit 18 may be 95° C. or higher.

Further, in the embodiment, in order to maintain the processing fluid in the drying unit 18 at a high temperature, the temperature of the processing fluid in a supercritical state generated by the heater 44 may be higher than the temperature of the processing fluid in the drying unit 18. For example, the temperature of the processing fluid in a supercritical state generated by the heater 44 may be in a range of 110° C. to 120° C.

Therefore, even when the temperature of the processing fluid is reduced due to adiabatic expansion while passing through the orifice 46, it is possible to maintain the temperature of the processing fluid in the drying unit 18 at 90° C. or higher.

In the embodiment, when the temperature of the processing fluid in the drying unit 18 is too high (e.g., when the temperature of the processing fluid is higher than 100° C.), the liquid film of the IPA liquid formed on the wafer W may be dried due to the high temperature of the processing fluid.

Therefore, since problems such as collapse of the pattern formed on the wafer W occur, it is not desirable to set the temperature of the processing fluid in the drying unit 18 too high.

Further, the temperature of the processing fluid in the drying unit 18 may be monitored by a temperature sensor 49, and the temperature of the processing fluid in a supercritical state generated by the heater 44 may be monitored by the temperature sensor 45.

Figure 9:
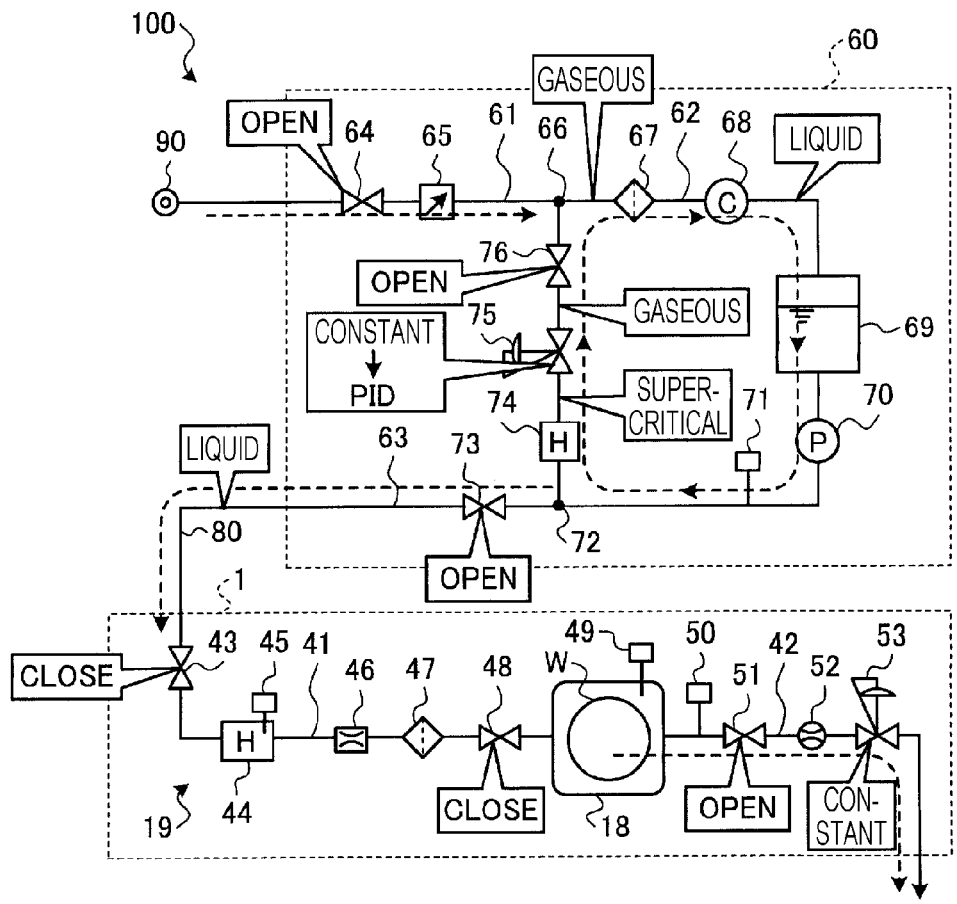
FIG. 9 is a view for explaining a depressurizing processing of the substrate processing system according to the embodiment.

Following the distributing processing, a depressurizing processing is performed from time T6 to time T7 in the substrate processing system 100. FIG. 9 is a view for explaining the depressurizing processing of the substrate processing system 100 according to the embodiment.

As illustrated in FIG. 9, in order to depressurize the inside of the drying unit 18, the valves 43 and the valve 48 in the circulation line 41 become the closed state, and the valve opening degree of the back pressure valve 53 on the discharge line 42 is changed to a predetermined constant opening degree. Therefore, as illustrated in FIG. 5, the internal pressure of the drying unit 18 is depressurized from the pressure P1 to the pressure P0 (atmospheric pressure).

Further, as illustrated in FIG. 9, at time T6, the valve opening degree of the back pressure valve 75 in the circulation line 62 is changed from the complete closed state to a predetermined constant opening degree, and the valve 76 becomes the open state, so that the circulation of the processing fluid in the circulation line 62 is resumed. Further, the valve opening degree of the back pressure valve 75 is switched to the PID control at time T7 at which a predetermined time (e.g., three seconds) is elapsed from time T6.

Therefore, as illustrated in FIG. 5, after the circulating pressure in the circulation line 62 reaches the pressure P4, the circulating pressure may be maintained at the pressure P4. Then, when the depressurizing processing is ended at time T8, the substrate processing system 100 returns to the standby processing described above.

<Modification>

Figure 10:
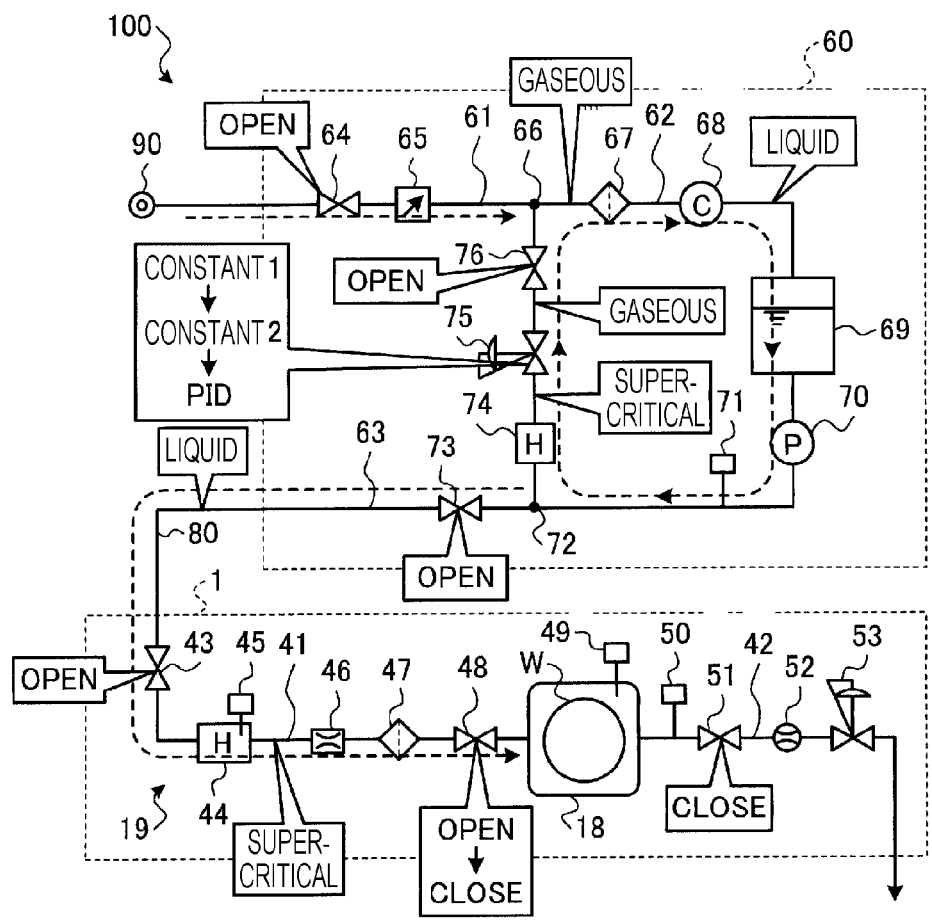
FIG. 10 is a view for explaining a pressure boosting processing and a maintaining processing of the substrate processing system according to a modification of the embodiment.

Consequently, descriptions will be made on a modification of the embodiment with reference to FIGS. 10 and 11. FIG. 10 is a view for explaining a pressure boosting processing and a maintaining processing of the substrate processing system 100 according to the modification of the embodiment.

This modification is different from the embodiment in that the discharge capacity of the pump 70 is improved as compared with that of the embodiment. Accordingly, unlike the embodiment, it is possible to continuously maintain the circulation of the processing fluid in the circulation line 62 without closing the back pressure valve 75 and the valve 76 even when the pressure boosting processing is started.

That is, as illustrated in FIG. 10, when the pressure boosting processing is started, the valve 76 is continuously maintained in the open state. Further, the valve opening degree of the back pressure valve 75 is changed from the PID control to a predetermined constant opening degree 1 at time T1 (see FIG. 5) at which the pressure boosting processing is started. Consequently, at time T2 at which a predetermined time (e.g., three seconds) is elapsed from time T1, the valve opening degree of the back pressure valve 75 is changed from the predetermined constant opening degree 1 to a predetermined constant opening degree 2.

Then, the circulating pressure in the circulation line 62 is further increased, and the valve opening degree of the back pressure valve 75 is switched to the PID control at time T3 (see FIG. 5) at which the predetermined pressure P3 (see FIG. 5) (e.g., 18 MPa) is reached. Therefore, as the embodiment, after the circulating pressure in the circulation line 62 reaches the pressure P4 (see FIG. 5), the circulating pressure may be maintained at the pressure P4.

Figure 11:
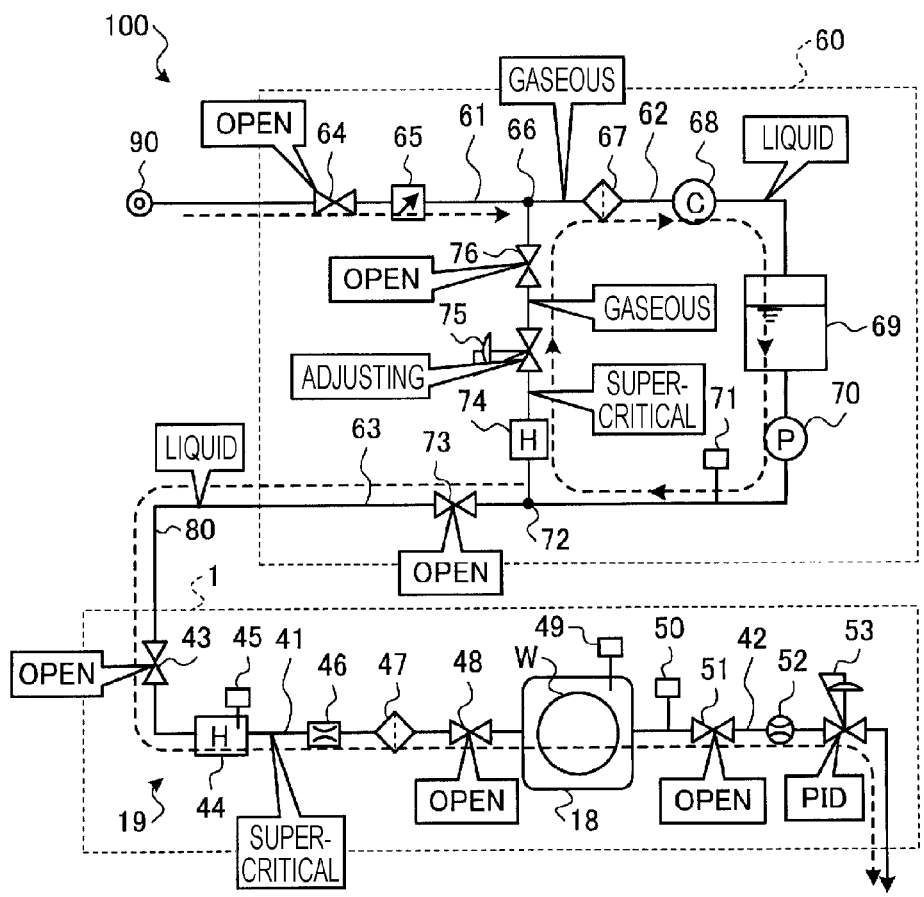
FIG. 11 is a view for explaining a distribution processing of the substrate processing system according to the modification of the embodiment.

FIG. 11 is a view for explaining a distributing processing of the substrate processing system 100 according to the modification of the embodiment. As described above, since the discharge capacity of the pump 70 is improved in the modification, as illustrated in FIG. 11, it is possible to continuously maintain the circulation of the processing fluid in the circulation line 62 during the distributing processing as well.

Here, when the flow velocity of the processing fluid flowing through the substrate processing apparatus 1 is excessively large, a problem that the patterns on the wafer W are collapsed due to the rapid flow of the processing fluid may occur. Therefore, in the modification, since the supply amount of the processing fluid supplied to the substrate processing apparatus 1 may be reduced by increasing the circulating amount of the processing fluid in the circulation line 62, it is possible to suppress the flow velocity of the processing fluid flowing through the substrate processing apparatus 1.

Specifically, the flow rate of the processing fluid flowing through the discharge line 42 by the flow meter 52 provided on the discharge line 42 of the substrate processing apparatus 1, and the valve opening degree of the back pressure valve 75 is appropriately adjusted based on the flow rate of the processing fluid flowing through the discharge line 42. Therefore, in the modification, it is possible to adjust the supply amount of the processing fluid supplied to the substrate processing apparatus 1 to an appropriate range.

The adjustment of the valve opening degree of the back pressure valve 75 may be adjusted by confirming that the processing fluid is flowing at a desired flow rate with the flow meter 52 first, and then, fixing with the valve opening of the back pressure valve 75 at the time of being confirmed. Further, in the adjustment of the valve opening degree of the back pressure valve 75, the valve opening degree of the back pressure valve 75 may be feedback-controlled based on the flow rate of the processing fluid measured at any time by the flow meter 52.

The substrate processing system 100 according to the embodiment includes the substrate processing apparatus 1 configured to process the substrate (wafer W) with the processing fluid, and the processing fluid supply apparatus 60 configured to supply the processing fluid to the substrate processing apparatus 1. The processing fluid supply apparatus 60 includes the circulation line 62, the gas supply line 61, the cooler (condenser 68), the pump 70, the branch line 63, the heating unit (spiral heater 74), and the pressure regulator (back pressure valve 75). The circulation line 62 circulates the processing fluid. The gas supply line 61 supplies the processing fluid in a gaseous state to the circulation line 62. The cooler (condenser 68) is provided in the circulation line 62, and cools the processing fluid in a gaseous state to generate the processing fluid in a liquid state. The pump 70 is provided on the downstream side of the cooler (condenser 68) in the circulation line 62. The branch line 63 is connected to the downstream side of the pump 70 in the circulation line 62, and branches the processing fluid in a liquid state from the branch 72. The heating unit (spiral heater 74) is provided at the downstream side of the branch 72, and heats the processing fluid in a liquid state to generate the processing fluid in a supercritical state. The pressure regulator (back pressure valve 75) is provided at the downstream side of the heating unit (spiral heater 74) in the circulation line 62 and at the upstream side of the gas supply line 61, and depressurizes the processing fluid in a supercritical state to generate the processing fluid in a gaseous state. Therefore, when the processing fluid in a liquid state is sent by the pump 70, the influence of the pulsation generated by the pump 70 may be reduced.

In the substrate processing system 100 according to the embodiment, the processing fluid supply apparatus 60 further includes the filter 67 which is provided between the gas supply line 61 and the cooler (condenser 68) in the circulation line 62, and configured to filter the processing fluid in a gaseous state. Therefore, since the foreign matters contained in the processing fluid may be effectively removed, it is possible to effectively prevent the occurrence of particles on the surface of the wafer W during the drying processing of the wafer W using the supercritical fluid.

In the substrate processing system 100 according to the embodiment, the processing fluid supply device 60 supplies the processing fluid in a liquid state from the branch line 63 to the substrate processing apparatus 1. Therefore, even if the distance between the processing fluid supply apparatus 60 and the substrate processing apparatus 1, that is, the length of the connecting line 80 is varied, problems due to the variation in the length may be reduced.

In the processing system 100 according to the embodiment, the substrate processing apparatus 1 includes another heating unit (heater 44), and the substrate processor (drying unit 18). The another heating unit (heater 44) heats the processing fluid in a liquid state to generate the processing fluid in a supercritical state. The substrate processor (drying unit 18) processes the substrate (wafer W) with the processing fluid in a supercritical state supplied from the another heating unit (heater 44). Therefore, it is possible to suppress the pattern from being collapsed during the drying processing.

In the substrate processing system 100 according to the embodiment, the temperature of the processing fluid in a supercritical state in the substrate processor (drying unit 18) is 90° C. or higher. Therefore, it is possible to prevent the occurrence of particles on the surface of the wafer W during the drying processing of the wafer W using the supercritical fluid.

In the substrate processing system 100 according to the embodiment, the temperature of the processing fluid in a supercritical state generated by the another heating unit (heater 44) is higher than the temperature of the processing fluid in the substrate processor (drying unit 18). Therefore, even when the temperature of the processing fluid is reduced due to adiabatic expansion while passing through the orifice 46, it is possible to maintain the temperature of the processing fluid in the drying unit 18 at 90° C. or higher.

<Details of Processing Fluid Supply Apparatus>

Figure 12:
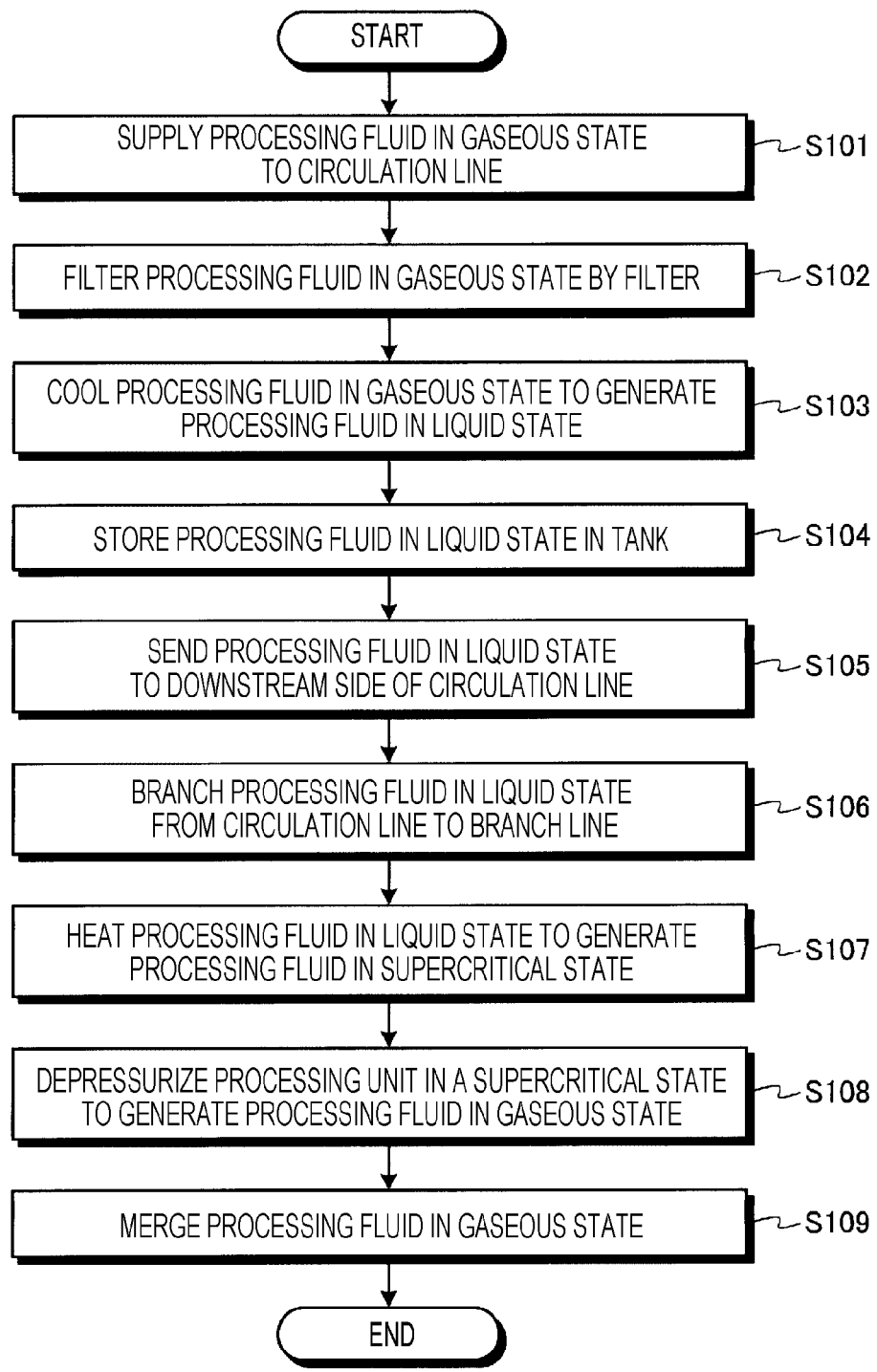
FIG. 12 is a flowchart illustrating a processing procedure of a processing fluid supply processing according to the embodiment.

Consequently, descriptions will be made on the details of the processing fluid supply processing executed by the processing fluid supply apparatus 60 according to the embodiment with reference to FIG. 12. FIG. 12 is a flowchart illustrating a processing procedure of the processing fluid supply processing according to the embodiment.

First, the controller 7 operates the valve 64 and the flow regulator 65 to supply the processing fluid in a gaseous state from the processing fluid supply source 90 to the circulation line 62 (step S101). Then, the controller 7 causes to filter the processing fluid in a gaseous state flowing through the circulation line 62 by the filter 67 (step S102).

Next, the controller 7 causes the processing fluid in a gaseous state filtered by the filter 67 to be cooled by the condenser 68 to generate the processing fluid in a liquid state (step S103). Then, the controller 7 causes to store the processing fluid in a liquid state generated by the condenser 68 in the tank 69 (step S104).

Next, the controller 7 causes the processing fluid in a liquid state stored in the tank 69 to be sent by the pump 70 to the downstream side of the circulation line 62 (step S105). Then, the controller 7 causes the processing fluid in a liquid state sent by the pump 70 to be branched from the circulation line 62 to the branch line 63 (step S106).

Next, the controller 7 causes the spiral heater 74 to heat the processing fluid in a liquid state flowing through the supply line 62 to generate the processing fluid in a supercritical state (step S107). Then, the controller 7 causes the back pressure valve 75 to depressurize the processing fluid in a supercritical state generated by the spiral heater 74 to generate the processing fluid in a liquid state (step S108).

Finally, the controller 7 causes the processing fluid in a gaseous state generated by the back pressure valve 75 to be merged with the processing fluid in a gaseous state supplied from the processing fluid supply source 90 (step S109), and completes the processing.

A method for supplying the processing fluid according to the embodiment includes a supply process (step S101), a process of generating a processing fluid in a liquid state (step S103), a branching process (step S106), and a process of generating a processing fluid in a supercritical state (step S107). In the supply process (step S101), the processing fluid in a gaseous state is supplied to the circulation line 62.

In the process of generating the processing fluid in a liquid state (step S103), the processing fluid in a gaseous state is cooled in the circulation line 62, and the processing fluid in a liquid state is generated. In the branching process (step S106), the processing fluid in a liquid state is branched from the circulation line 62 to the branch line 63. In the process of generating the processing fluid in a supercritical state (step S107), the processing fluid in a liquid state is heated in the circulation line 62, and the processing fluid in a supercritical state is generated. Therefore, when the processing fluid in a liquid state is sent by the pump 70, the influence of the pulsation generated by the pump 70 may be reduced.

In the above, although the exemplary embodiment of the present disclosure has been described, the present disclosure is not limited the above embodiment, and various modifications may be made without departing from the gist of the present disclosure. For example, in the above embodiment, the example in which the back pressure valve 75 is used as a pressure regulator that generates the processing fluid in a liquid state by depressurizing the processing fluid in a supercritical state is illustrated. However, the pressure regulator is not limited to the back pressure valve, but may be, for example, an orifice.

According to the present disclosure, when the processing fluid in a liquid state is sent by the pump, the influence of the pulsation generated by the pump may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system comprising:
a substrate processing apparatus configured to process a substrate with a processing fluid;
a processing fluid supply apparatus configured to supply the processing fluid to the substrate processing apparatus; and
a controller configured to control an overall operation of the substrate processing system,
wherein the processing fluid supply apparatus includes:
a circulation line configured to circulate the processing fluid;
a gas supply line configured to supply the processing fluid to the circulation line;
a cooler provided in the circulation line and configured to cool the processing fluid;
a filter provided between the gas supply line and the cooler in the circulation line and configured to filter the processing fluid;
a pump provided at a downstream side of the cooler in the circulation line;
a branch line connected to a downstream side of the pump in the circulation line and configured to branch the processing fluid from a branch portion;
a first heater provided at a downstream side of the branch portion and configured to heat the processing fluid; and
a pressure regulator provided at a downstream side of the first heater in the circulation line and at an upstream side of the gas supply line and configured to depressurize the processing fluid;
a valve provided at a downstream side of the pressure regulator in the circulation line and at the upstream side of the gas supply line,
wherein the controller is programmed to:
control the gas supply line to supply a first gaseous-state processing fluid to the circulation line;
control the cooler to cool the first gaseous-state processing fluid to generate a liquid-state processing fluid;
control the first heater to heat the liquid-state processing fluid to generate a supercritical-state processing fluid;
control the pressure regulator to depressurize the supercritical-state processing fluid to generate a second gaseous-state processing fluid;
control the valve to merge the second gaseous-state processing fluid generated by the pressure regulator with the first gaseous-state processing fluid from the gas supply line to form a merged processing fluid in a gaseous-state, and then supply the merged processing fluid in the gaseous-state to the filter in the circulation line to filter the merged processing fluid.

2. The substrate processing system according to claim 1, wherein the processing fluid supply apparatus supplies the liquid-state processing fluid from the branch line to the substrate processing apparatus.

3. The substrate processing system according to claim 2, wherein the substrate processing apparatus includes:
a second heater configured to heat the liquid-state processing fluid thereby generating the supercritical-state processing fluid; and
a substrate processor configured to process the substrate with the supercritical-state processing fluid supplied from the second heater.

4. The substrate processing system according to claim 3, wherein the supercritical-state processing fluid in the substrate processor is 90° C. or higher.

5. The substrate processing system according to claim 4, wherein a temperature of the supercritical-state processing fluid generated by the second heater is higher than a temperature of the supercritical-state processing fluid in the substrate processor.

6. The substrate processing system according to claim 1, wherein the processing fluid supply apparatus supplies the liquid-state processing fluid from the branch line to the substrate processing apparatus.

7. The substrate processing system according to claim 6, wherein the substrate processing apparatus includes:
a third heater configured to heat the liquid-state processing fluid thereby generating the supercritical-state processing fluid; and
a substrate processor configured to process the substrate with the supercritical-state processing fluid supplied from the third heater.

8. The substrate processing system according to claim 7, wherein the supercritical-state processing fluid in the substrate processor is 90° C. or higher.

9. The substrate processing system according to claim 8, wherein a temperature of the supercritical-state processing fluid generated by the third heater is higher than a temperature of the processing fluid in the substrate processor.

10. The substrate processing system according to claim 7, wherein a temperature of the supercritical-state processing fluid generated by the third heater is higher than a temperature of the processing fluid in the substrate processor.

11. A method for supplying a processing fluid, the method comprising:
Providing the substrate processing system of claim 1
supplying the first gaseous-state processing fluid to the circulation line;

cooling the first gaseous-state processing fluid in the circulation line thereby generating the liquid-state processing fluid;
branching the liquid-state processing fluid from the circulation line to the branch line;
heating the liquid-state processing fluid in the circulation line thereby generating the supercritical-state processing fluid,
depressurizing the supercritical-state processing fluid to generate the second gaseous-state processing fluid;
merging the second gaseous-state processing fluid with the first gaseous-state processing fluid to form the merged processing fluid in a gaseous-state; and
filtering the merged processing fluid in the gaseous-state using the filter in the circulation line.

\* \* \* \* \*